United States Patent [19]

Martens, deceased et al.

[11] 4,105,512
[45] Aug. 8, 1978

[54] METHOD FOR THE MANUFACTURE OF A SUPERCONDUCTIVE Nb₃Sn LAYER ON A NIOBIUM SURFACE FOR HIGH FREQUENCY APPLICATIONS

[75] Inventors: Hans Martens, deceased, late of Erlangen, Fed. Rep. of Germany, by Hildegard Martens; Harald Martens, legal heir; Rainer Martens, legal heir, both of Erlangen, Fed. Rep. of Germany; Hans-Wolfgang Martens, legal heir, Aachen, Fed. Rep. of Germany; Günter Martens, legal heir, Buckenhof, Fed. Rep. of Germany; Sigrid Martens, legal heir, Nuremberg, Fed. Rep. of Germany; Hannelore Martens, legal heir; Helmut Martens, legal heir, both of Erlangen, Fed. Rep. of Germany

[73] Assignee: Siemens Aktiengesellschaft, Munich, Fed. Rep. of Germany

[21] Appl. No.: 768,831

[22] Filed: Feb. 15, 1977

[30] Foreign Application Priority Data

Feb. 27, 1976 [DE] Fed. Rep. of Germany ....... 2608089

[51] Int. Cl.² .................. C25D 11/02; C25D 5/50; H01L 39/24
[52] U.S. Cl. .................. 204/38 A; 204/35 N; 204/37 R; 29/599; 427/62; 427/250; 427/383 D
[58] Field of Search ............ 204/33, 35 N, 37 R, 204/38 A; 427/62, 250, 383 D, 419 R; 29/599

[56] References Cited

U.S. PATENT DOCUMENTS

| | | | |
|---|---|---|---|
| 3,661,639 | 5/1972 | Caslaw | 204/38 A |
| 3,902,975 | 9/1975 | Martens | 204/35 N |

FOREIGN PATENT DOCUMENTS 2,106,628  7/1973  Fed. Rep. of Germany ............ 204/33

OTHER PUBLICATIONS

IEEE Transactions on Magnetics, vol. Mag-11, No. 2, Mar. 1975, pp. 420–422.

*Primary Examiner*—G. L. Kaplan
*Assistant Examiner*—William T. Leader
*Attorney, Agent, or Firm*—Kenyon & Kenyon, Reilly, Carr & Chapin

[57] ABSTRACT

A method for the manufacture of a superconductive Nb₃Sn layer on a niobium surface for high frequency applications in which the niobium surface to be provided with an Nb₃Sn layer is first anodically oxidized, the niobium oxide layer produced in this manner then exposed to a tin vapor atmosphere in such a way that a tin layer is formed on the niobium oxide layer, and finally, the niobium surface is heated to a temperature of between 930° and about 1400° C for forming the Nb₃Sn layer.

16 Claims, 4 Drawing Figures

METHOD FOR THE MANUFACTURE OF A SUPERCONDUCTIVE Nb₃Sn LAYER ON A NIOBIUM SURFACE FOR HIGH FREQUENCY APPLICATIONS

BACKGROUND OF THE INVENTION

The invention relates to superconductors in general and more particularly to an improved method for manufacturing a superconductive $Nb_3Sn$ layer on a niobium surface for high frequency applications through the diffusion of tin into this surface at elevated temperature.

Superconducting devices for operation with high frequency electromagnetic fields at frequencies of about 10 MHz and higher find many engineering applications. They can be employed, in particular, as resonators and separators for particle accelerators or as high frequency resonators for other purposes, e.g., as frequency standards. They may be designed, in this connection particularly, as cavity resonators or as helical resonators. Superconducting cavity resonators are operated in the frequency range of, say, 1 to 15 GHz and superconducting helical resonators in the range around 100 MHz. Niobium and, occasionally, also lead have mostly been used as superconductive materials for such resonators.

In such superconducting devices, a high quality factor and as a rule, also the highest possible critical magnetic flux density $B_c^{ac}$, measured under the influence of high frequency fields, so that the superconducting devices can be operated with maximum high frequency power and, at the same time, with low surface resistance is desired. For, if the critical magnetic flux density $B_c^{ac}$ is exceeded, then the losses rise sharply, the surface resistance increases considerably and the electromagnetic field breaks down. The upper limit for $B_c^{ac}$ is given by what is known as the thermodynamic critical flux density $B_c$. Since the thermodynamic critical flux density $B_c$ of $Nb_3Sn$ is higher than that of niobium, it can be expected that a higher critical flux density $B_c^{ac}$ can be achieved at an $Nb_3Sn$ surface than at a niobium surface. In addition, $Nb_3Sn$ also has a considerably higher critical temperature than niobium, so that it has, for one, a higher thermal stability and, on the other hand, should permit also higher operating temperatures than niobium, particularly for operation at the temperature of boiling liquid helium of 4.2° K, which is already too high for high frequency applications of niobium.

There have been attempts at applying thin protective layers of $Nb_3Sn$ by first evaporating tin onto the niobium resonator and then heat treating the latter. With such surface layers, a quality factor $Q_o$ of about $10^9$ and a critical flux density $B_c^{ac}$ of about 25 mT have been measured at 2.8 GHz (cf., "Siemens- Forschungs- and Entwicklungsberichte" 3 (1974), page 96, righthand column).

In addition, it is known to expose the niobium parts which are to be provided with an $Nb_3Sn$ layer, in a closed reaction vessel, i.e., a closed off, evacuated quartz ampoule, at an elevated temperature of about 1000° C to a tin vapor atmosphere, from which the tin diffuses into the niobium surface, forming the desired $Nb_3Sn$ layer. With this method, $Nb_3Sn$ layers of several micrometers thickness and with already relatively good properties, e.g., quality factors $Q_o$ of about $10^9$ and critical magnetic flux densities $B_c^{ac}$ of somewhat above 40mT at 1.5 K, can be obtained (paper by Hillenbrand et al in "IEEE Transactions on Magnetics," vol. MAG-11, No. 2, March 1975, pages 420 to 422).

SUMMARY OF THE INVENTION

It is an object of the present invention to further improve the manufacture of superconductive $Nb_3Sn$ layers on niobium surfaces for high frequency applications. In particular, a further increase of the quality factor and the critical magnetic flux density of the $Nb_3Sn$ layers produced is sought, the stress being particularly on high quality factors at temperatures which are already too high for high frequency applications of niobium, i.e., particularly at the temperature of the boiling liquid helium of 4.2° K.

For solving this problem, starting with a method of the general type mentioned above, according to the present invention, the niobium surface to be provided with the $Nb_3Sn$ layer is first anodically oxidized, then the thus produced niobium oxide layer is exposed to a tin vapor atmosphere in such a manner that a tin layer is formed on the niobium oxide layer, and, finally, the niobium surface is heated to a temperature of between 930° and about 1400° C for forming the $Nb_3Sn$ layer.

The niobium oxide layer which is first generated on the niobium surface by anodic oxidation in the method according to the present invention (this is an amorphous layer of niobium pentoxide) has an extremely advantageous effect on the later formation of the $Nb_3Sn$ layer. In particular, a uniform tin layer can form on the niobium oxide layer; this tin layer can diffuse into the niobium surface in the later heating to the temperature of between 930° and about 1400° C and can form a very uniform $Nb_3Sn$ layer through reaction with the niobium. In control tests, in which a niobium surface which was not anodically oxidized was exposed to a tin vapor atmosphere, it was found, in contrast, after the final heat treatment for forming the $Nb_3Sn$ layer, that many crystal grains of the niobium surface were poorly coated with $Nb_3Sn$ and that in part, bare niobium surfaces were still present. Evidently, the niobium oxide layer, which dissolves at a temperature of between about 500° and 600° C, largely equalizes the different influences on the seed formation in the generation of the $Nb_3Sn$ layer which occur in a bare niobium surface because of its surface grain structure.

It is particularly advantageous if the heating for forming the $Nb_3Sn$ layer takes place in the presence of a tin source, as, thereby, excessive evaporation of tin from the niobium surface can be prevented and, if required, additional tin can be supplied from the tin vapor atmosphere for forming the $Nb_3Sn$ layer.

The method according to the present invention can be carried out particularly simply and, therefore, advantageously in such a manner that the anodically oxidized niobium surface is placed, together with a tin source, into an evacuable reaction chamber and the latter, after evacuation, is heated in such a manner that, for forming the tin layer on the niobium oxide layer, the tin source is at first at a temperature higher than the niobium surface and subsequently, the tin source and the niobium surface are brought to about the same temperature between 930° and about 1400° C. In this embodiment of the method according to the present invention, the formation of the tin layer on the niobium oxide layer and the subsequent generation of the $Nb_3Sn$ layer can take place in immediately succeeding steps in the same reaction chamber.

The temperature range between 930° and 1400° C is particularly advantageous for the formation of the $Nb_3Sn$ layer. Below 930° C, there is danger that undesirable, tin rich phases of the niobium tin system may form. Above 1400° C, on the other hand, the growth of the layer can be controlled only with difficulty.

It has been found to be particularly advantageous in view of the quality and the critical magnetic flux density of the Nb$_3$Sn layer formed to first heat the anodically oxidized niobium surface over a time period of between about 30 minutes and 2 hours, and preferably about 60 minutes, from room temperature to a temperature of between 500° and 600° C and the tin source from room temperature to a temperature of between 800° and 900° C, to continue heating the niobium surface and the tin source for a time period of about 20 to 40 minutes to a temperature of between 1000° and 1100° C and to the hold them at this temperature for the Nb$_3$Sn layer to develop. The shorter the first heating phase is chosen, the longer should be the second heating phase. In the case of thick Nb$_3$Sn layers, the time for forming the Nb$_3$Sn layer, during which the niobium surface and the tin source are held at the temperature of between 1000° and 1100° C reached after the second phase, may be up to 100 hours.

With the method according to the present invention, the coating of the niobium oxide layer with a tin layer and the subsequent heat treatment for forming the Nb$_3$Sn layer can be performed in an evacuated, closed, for instance, sealed reaction chamber. It is even more advantageous, however, to form a reaction zone in an evacuable reaction chamber, with the reaction zone separated from the remaining chamber volume. The separated reaction zone containes the tin source and the niobium surface to be provided with the Nb$_3$Sn layer, and is sealed off from the rest of the chamber volume to the extent that gases present or produced within the reaction zone during the evacuation are drawn off from the latter, but the tin vapor pressure within the reaction zone remains higher during the later heating than the tin vapor pressure in the rest of the chamber. The reaction chamber is continuously pumped out during the heating and the subsequent heat treatment.

This procedure, in which an open reaction chamber is used and which has already been proposed in a similar form in the German Patent Application File No. P 25 32 570.6-45, has numerous advantages over working in a closed reaction ampoule. First of all, an open reaction chamber can be used over and over again, while a closed reaction ampoule must, as a rule, be destroyed upon opening. Furthermore, in working with an open reaction chamber, the gases which are separated from the surface of the heated parts in the course of the heating, or which emanate from the heated parts, are continuously pumped off, while in working with a closed ampoule, the gases produced in or after the sealing remain enclosed in the ampoule and can lead to disturbances of the Nb$_3$Sn layer. Through the formation of the reaction zone, which is sealed off from the rest of the volume of the reaction chamber, it is possible to prevent too much tin from diffusing away in the direction toward the cold end of the reaction chamber and the pump connected there, although the reaction chamber is open during the formation of the tin layer on the niobium oxide layer as well as the subsequent formation of the Nb$_3$Sn layer. It is particularly advantageous if the niobium surface which is to be provided with the Nb$_3$Sn layer itself forms a boundary surface of the reaction zone. To further delineate the reaction zone, quartz, for instance, can be used. In order to prevent a reaction of tin with the quartz walls and the incorporation of silicon into the Nb$_3$Sn layer, a reaction temperature of 1050° C should not be exceeded, if possible, if quartz is used. However, such difficulties can advantageously be avoided if only niobium surfaces or anodically oxidized niobium surfaces are used to separate off the reaction zone. One or more of these niobium surfaces can again be the surface which themselves are to be coated with the Nb$_3$Sn layer. In this procedure, the reaction zone is separated advantageously in such a manner that the total cross section of the connecting paths between the interior of the sealed reaction zone and the rest of the reaction chamber, i.e., the total leakage cross section of the reaction zone, is smaller than the surface of the tin source, from which tin evaporates into the reaction zone. With such a design of the leakage cross section, only less than one-half of the evaporating tin can then pass from the reaction zone into the reaction chamber. It is particularly advantageous, however, for reducing the tin losses further, that the total leakage cross section be at most 25% of the surface of the tin source. However, in most cases the total leakage cross section cannot be determined and one rather depends on estimates. With a total leakage cross section in the order of 0.1 cm$^2$, very good evacuation of the gases which are present or occur within the reaction zone is still obtained, since they have a molecular weight substantially lower than tin and are, therefore, pumped off much more rapidly than, for instance, tin vapor.

Besides the effects of the surface area of the tin source and the leakage cross section of the reaction zone, however, the tin vapor pressure is further determined by the size of the niobium surface to be provided with the Nb$_3$Sn layer, since the tin which is deposited on the niobium oxide layer or diffuses at elevated temperature into the niobium surface after this oxide layer is dissolved, is removed from the vapor space. In order that the tin vapor pressure in the reaction chamber does not become too low for this reason, and the reaction time therefore do not become too long, the surface of the tin source should, if possible, be chosen larger than 0.2% and preferably larger than 1% of the niobium surface to be provided with the Nb$_3$Sn layer. Possible other niobium surfaces which separate off the reaction zone, to the extent that Nb$_3$Sn layers can form there, must be taken into consideration accordingly.

During the heating up and the subsequent reaction time, one will, of course, evacuate the reaction chamber as much as possible. It has been found advantageous to pump off the reaction chamber and to heat up the reaction zone in such a manner that during the heating up and during the reaction time, a residual gas pressure of $10^{-4}$ Torr, measured at the cold end of the reaction chamber connected to the pump is not exceeded or only briefly so.

The niobium pentoxide layer which is to be generated by anodic oxidation on the niobium surface to be provided with the Nb$_3$Sn layer should preferably be 0.01 to 0.3 $\mu$m thick, since oxide layers of less than 0.01 $\mu$m thick practically do not yet show advantageous effects on the properties of the Nb$_3$Sn layer which is to be formed later, while if a layer thickness of 0.3 $\mu$m is exceeded, an undesirable oxide of grey color can easily form in the anodic oxidation. Particularly advantageous for the method according to the invention is a niobium pentoxide layer 0.04 to 0.15 $\mu$m thick. Particularly well suited for the anodic oxidation is the method known from the German Pat. No. 2 106 628, in which the anodic oxidation is performed in an aqueous ammonia solution, preferably with 20 to 30% by weight of ammonia.

For the finished Nb$_3$Sn layer, a layer thickness of about 0.5 to 5 μm is advantageous, which can be set by appropriately apportioning the heating time for forming the Nb$_3$Sn layer. On the one hand, such layers are thick enough so that the electromagnetic fields and currents penetrate only into the Nb$_3$Sn layer and not into the underlying niobium layer. For, otherwise, the quality factor and the critical magnetic flux density of the surface would not be determined by the Nb$_3$Sn layer but by the underlying niobium layer. On the other hand, the Nb$_3$Sn layers of the thickness mentioned are also thin enough that the loss heat produced in the Nb$_3$Sn layer can be removed over a very short path into the niobium, the thermal conductivity of which is higher than that of the Nb$_3$Sn, and from there into the coolant which is in contact with the niobium body in the operation of the apparatus.

The high frequency properties of the Nb$_3$Sn layer formed can be improved further if an oxide layer is formed on the generated Nb$_3$Sn layer by anodic oxidation and subsequently is chemically dissolved again. The generation and dissolution of the oxide layer can also be repeated several times. An aqueous ammonia solution with 20 to 30% by weight of ammonia is again well suited for generating the oxide layer and hydrofluoric acid of 40 to 50% for chemically dissolving the oxide layer (cf., IEEE Transactions on Magnetics, vol. MAG-11, No. 2, q975, pages 420 to 422, and German Offenlegungsschrift 24 28 867).

DETAILED DESCRIPTION OF THE INVENTION

Figure 1:
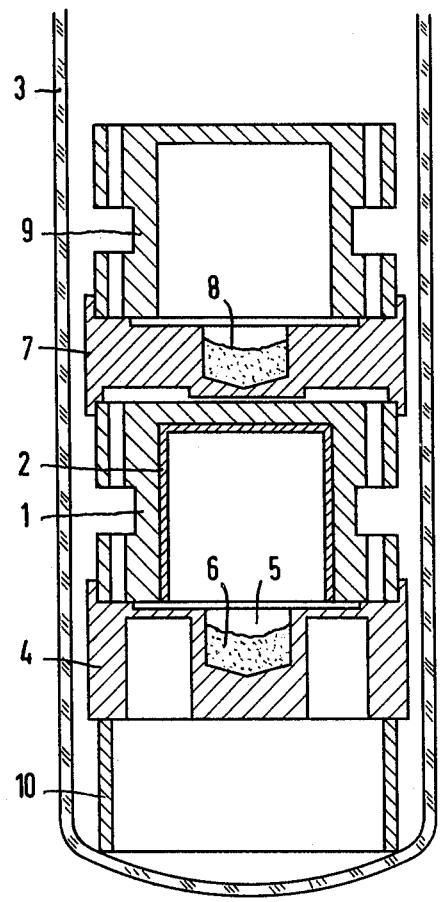
FIG. 1 is a schematic section of a reaction chamber suited for implementing the method according to the present invention.

In FIG. 1, a cup shaped niobium part 1 for a conventional cavity resonator in the shape of a circular cylinder of the TE$_{011}$ field type for an X-band frequency of 9.5 GHz is shown, the inside diameter and inside height of which are each 41 mm. The preparation of a superconductive Nb$_3$Sn layer on the inside surface of this cup shaped niobium part 1 will be explained in detail in the following as an example of the method according to the present invention.

As the starting material for the niobium part 1, niobium of the usual purity (reactor quality, purity 99.8%) was used which was cold worked by the supplier and recrystallized for small grain. The niobium part 1 was turned from solid material and subsequently annealed in an ultra-high vacuum at a temperature of 1900° C for 50 hours. After this, the mean grain size was about 5 mm. Subsequently, a layer about 150 μm thick was removed from the surface of this niobium part by anodic polishing with oscillating current. The polishing method, which preferably works with an electrolyte consisting of 89.0 to 90.5% by weight H$_2$SO$_4$. 2.2 to 3.0% by weight HF and the remaining weight share H$_2$O at a temperature of 20 to 35° C and with constant voltages between 11 and 13 V, is described in detail in the German Patent 20 27 156. After the anodic polishing, a layer about 70 μm thick is again removed by chemical polishing in a polishing solution consisting of one part concentrated nitric acid and one part 40% hydrofluoric acid. Both polishing steps were used to remove those niobium surface layers which had dislocations in their structure due to the preceding machining. After the polishing, the cup shaped niobium part 1 had a very smooth surface.

The inside surface of the niobium part 1 was then provided with a niobium pentoxide layer 2 by anodic oxidation. The niobium part 1 itself was used as a vessel for the oxidation bath and was filled to the rim with an aqueous ammonia solution with 25% by weight ammonia. Subsequently, the niobium part 1 was connected to the positive terminal of a voltage source. A niobium tube of about 20 mm outside diameter and about 30 mm depth was immersed in the bath coaxially to the cylinder axis of the niobium part 1 as the cathode. The bath temperature was about 20° C. The anodic oxidation was performed with a constant voltage of 50 V between the anode and the cathode. The initial current density on the inside surface of the niobium part 1 was about 15 mA/cm$^2$. The current decreases with increasing thickness of the oxide layer. At a current density of about 1 mA/cm$^2$, the oxidation process was completed. At this low current density, the voltage drop in the electrolyte is small, so that the voltage of 50 V drops practically across the oxide layer 2, which then has a uniform thickness of about 0.1 μm. After it was emptied out, the niobium part 1 was then rinsed with distilled water.

For preparing the Nb$_3$Sn layer, the niobium part 1 was placed in a quartz tube 3, which forms an evacuable reaction chamber. The niobium part 1 was placed on a lower part 4, which consists likewise of niobium and in the center of which there was a depression 5, into which a tin supply 6 (p.a. quality, purity 99.96%) was placed. The surface of the tin supply 6 placed in the depression 5 may advantageously be about 2 cm$^2$ in the melted state, i.e., about 3% of the niobium surface to be provided with the Nb$_3$Sn layer. The niobium part 1 and the lower niobium part 4 form a reaction zone which is separated from the remaining volume of the quartz tube 3 and contains the tin source 6 as well as the anodically oxidized inner surface of the niobium part 1 which is to be provided with the Nb$_3$Sn layer. The end face of the niobium part 1 simply rests on the surface of the lower niobium part 4. The unevennesses of both surfaces have a maximum depth of about 50 μm. Thereby, a space is maintained between the two surfaces which is sufficient to evacuate the interior of the reaction zone enclosed by the parts 1 and 4 adequately but, on the other hand, is so small that during the later heating, the tin vapor pressure within the reaction zone remains higher than the tin vapor pressure in the remaining parts of the quartz tube 3. The total leakage cross section between the interior of the reaction zone and the remaining part of the quartz ampoule 3 is estimated as 0.15 cm.$^2$.

So that a second resonator can be provided with an Nb$_3$Sn layer in the same operation, a second niobium lower part 7 with a tin source 8 was placed on the niobium part 1, and a further cup shaped niobium part 9 was placed on top. The niobium parts 7 and 9 are not important for the further explanation of the method according to the invention, but are mentioned since they have influenced the temperature curve in the niobium parts 1 and 4, shown in FIG. 4, because of their heat retarding effect.

The tower-like arrangement consisting of the niobium parts 1, 4, 7 and 9 was disposed in the quartz ampoule 3 on a section of quartz tubing 10. All niobium parts were rinsed in acetone before being assembled.

Figure 2:
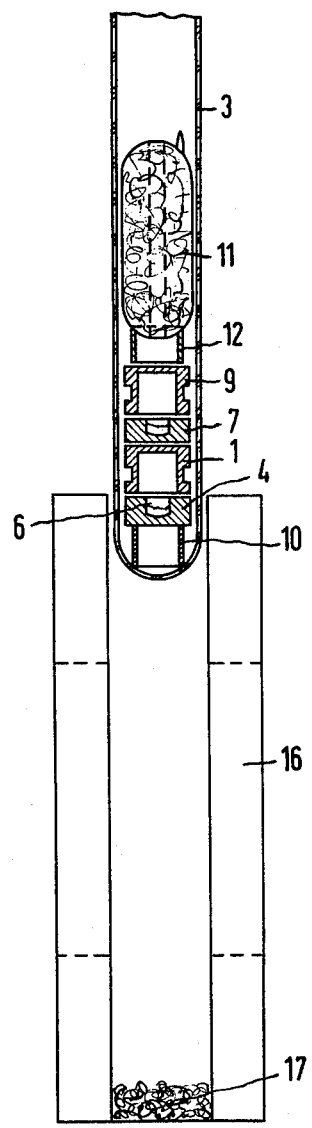
FIGS. 2 and 3 are schematic illustrations of an embodiment of a device for carrying out the method according to the present invention, in two different process phases.
Figure 3:
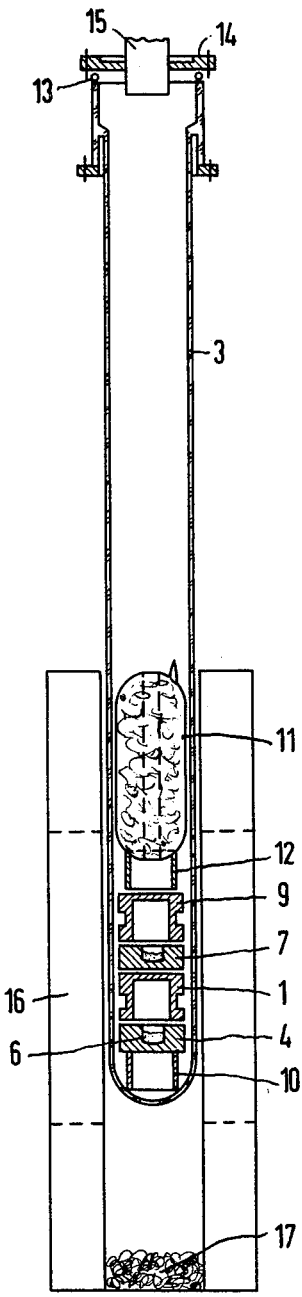

As shown in FIGS. 2 and 3, a further evacuated quartz ampoule 11, which was filled with quartz wool prior to installation and sealed by melting off, was also placed in the quartz ampoule 3 and mounted on the niobium part 9 by means of a section of quartz tubing 12. So as not to impede the evacuation of the lower part of the quartz ampoule 3, the quartz ampoule 11 was provided with an opening which is shown in dashed lines in FIGS. 2 and 3 and extends in the axial direction, and also did not fit tight into the inner wall of the quartz ampoule 3.

As shown in FIG. 3, the quartz ampoule 3 was connected at its open end, via an indium seal 13 and an alloy steel flange 14, to an alloy steel tube 15, which led to a molecular turbo pump. The quartz ampoule 3 was then evacuated at room temperature until a pressure of $5 \times 10^{-8}$ Torr prevailed at the end of the flexible tube 15 on the pump side. In the meantime, a vertically disposed, tubular resistance heating oven 16 was heated up to temperature of 1050° ±5° C. At the bottom, the oven was closed off by quartz wool 17.

At the start of the coating process, the quartz ampoule 3 was lowered into the oven 16, with the turbo molecular pump continuing to run to the extent that the upper edge of the lower niobium part 4 was lined up with the upper edge of the oven 16. In this position, shown in FIG. 2, the arrangement was left for one hour. During this time, the niobium parts 4, 1, 7 and 9 were heated to different temperatures, which decreased from the bottom to the top. As the heat conduction is better within the niobium parts than at the transition points between the niobium parts, a different temperature which, however, was approximately homogeneous within each part, adjusted itself in each of the four parts.

Figure 4:
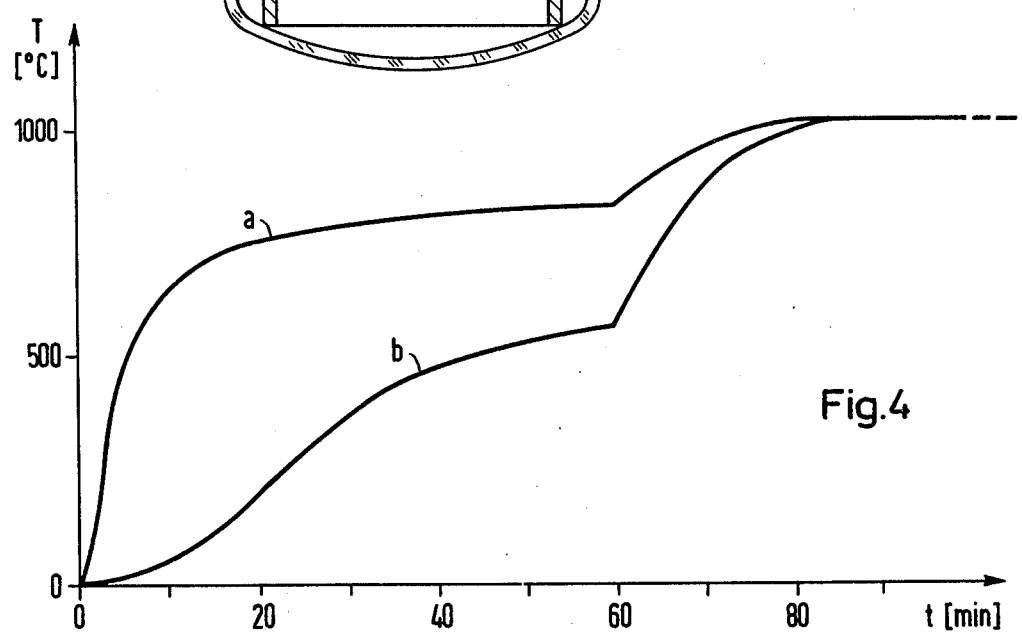
FIG. 4 shows the curve of the temperature of the niobium surface and the tin source as a function of time in an advantageous embodiment of the method according to the present invention.

FIG. 4 shows the temperatures measured at the niobium parts 1 and 4 during the heating up. The temperature T in ° C is plotted on the ordinate and the heating time $t$ in minutes on the abscissa. The temperature of the lower niobium part 4 and therefore, also of the tin source 6, is represented by the curve $a$, and the temperature of the cup shaped niobium part 1 by the curve $b$. As will be seen from FIG. 4, a maximum temperature difference of about 600° between the two parts was reached after about 12 minutes and decreased again after extended heating. After 60 minutes, the temperature of the lower niobium part 4 was about 830° C and temperature of the niobium part 1 about 570 ° C. During this time, a tin layer is deposited on the niobium pentoxide layer 2 from the tin vapor atmosphere which is formed in the space enclosed by the parts 1 and 4 during the heating. It is important for this deposition process that the tin source 6 be at a higher temperature, i.e., the temperature of the lower niobium part 4, than the inside surface of the niobium part 1.

After the mentioned heating time of 60 minutes, the quartz ampoule 3 was lowered deep enough into the oven 16, as shown in FIG. 3, that the niobium parts 1, 4, 7 and 9 were in the homogeneously heated middle part of the oven 16. The quartz ampoule 11 filled with quartz wool practically ensured that neither the inside walls of the oven 16 nor the heated niobium parts could radiate heat into the space outside the oven. Thus, a nearly homogeneous temperature distribution in the niobium parts was achieved after some time, the tin source 6 in the lower niobium part 4, in particular, being practically at the same temperature as the niobium part 1. As shown in FIG. 4, this homogeneous temperature distribution appeared about 25 minutes after the lowering of the quartz ampoule 3 into the oven 16, when a uniform temperature of about 99% of the final value of 1050° C was reached in the niobium parts 1 and 4. The niobium parts were subsequently left in the center part of the oven, heated to 1050° C, for another 3 hours. During this time, the desired $Nb_3Sn$ layer was formed at the inside surface of the niobium part 1. At the beginning of this time, the pressure at the already mentioned measuring point in the vicinity of the molecular turbo pump rose to about $10^{-5}$ Torr. At the end of the time of 3 hours, it was still about $5 \times 10^{31\ 6}$ Torr. It is important that, during this reaction time, the tin source 6 is not at a higher temperature than the inside surface of the niobium part 1, since, otherwise, it would be possible for tin vapor to condense at the inside surface of the niobium part 1 and tin droplets form there. In control tests, this undesirable effect was observed as soon as the temperature of the tin source 6 deviated by more than 10° C upward from the temperature of the niobium part 1 during the reaction time.

At the end of the three hour reaction time, the oven 16 was switched off, the quartz wool 17 was removed from the lower end of the oven and a slow stream of air was blown through the oven from the bottom to the top. In this process, the oven cooled down from the bottom up and the niobium part 1 was maintained somewhat warmer during the cooling than the lower niobium part 4 and the tin source 6. This prevents, in particular, condensation of tin vapor on the inside surface of the niobium part 1 during the cooling.

After a cooling time of 1.5 hours, the quartz ampoule 3 was pulled entirely out of the oven. The pressure at the measuring point near the molecular turbo pump was at that time still about $3 \times 10^{-7}$ Torr. The niobium parts 9, 7, 1 and 4, in the order named, still showed, at this time, distinct red incandescence to barely visible red icandescence. After another 1.5 hours, the pressure in the vicinity of the molecular turbo pump was still only $2.5 \times 10^{-8}$ Torr.

After having cooled down completely, the quartz ampoule 3 was vented with argon and opened. The niobium part 1 which now had an $Nb_3Sn$ layer about 1 $\mu$ thick, was subsequently cleaned with only acetone and then installed together with a usual coupler of niobium, with coupling lines leading into the resonator cavity from below, in a cryostat, as is known from the German Patent 2 164 529. Subsequently, the cavity resonator was evacuated by means of a molecular turbo pump to about $3 \times 10^{-8}$ Torr and then cooled, first with liquid nitrogen and a subsequently with liquid helium. At 4.2 K, the no load quality factor $Q_o$ was measured with a low magnetic induction $B \approx O$. By lowering the pressure above the helium bath, a temperature of 1.5 K was then adjusted and at this temperature, the no load quality factor $Q_o$ was measured at a low induction $B \sim O$ as well as at the maximum induction $B_c^{ac}$.

The values obtained here for the critical magnetic induction $B_c^{ac}$, at which the field breakdown takes place, and for the no load quality factor $Q_o$, the latter converted for a resonator which is coated with $Nb_3Sn$ on its entire inside surface including the coupler, are given in the following Table under Test No. 1.

| Test No. | $Q_o$ | | | $B_c^{ac}$ [mT] |
|---|---|---|---|---|
| | 4.2 K<br>$B \simeq 0$ | 1.5 K<br>$B \simeq 0$ | 1.5 K<br>$B = B_c^{ac}$ | |
| 1 | $1.4 \times 10^9$ | $2.1 \times 10^9$ | $1.6 \times 10^9$ | 73.3 |
| 2 | $1.6 \times 10^9$ | $6.0 \times 10^9$ | $2.3 \times 10^9$ | 101.0 |
| 3 | $1.5 \times 10^9$ | $2.0 \times 10^9$ | $1.4 \times 10^9$ | 89.5 |
| 4 | $1.1 \times 10^9$ | $1.9 \times 10^9$ | $1.1 \times 10^9$ | 101.0 |

After these measurements were completed and the resonator was removed from the cryostat, thin layers were removed in steps from the inside surface of the niobium part 1, provided with the Nb$_3$Sn layer by first generating an oxide layer by anodic oxidation in an aqueous ammonia solution with about 25% by weight ammonia and subsequently dissolving the layer again in 40% hydrofluoric acid. This method which is described in detail in the German Offenlegungsschrift 24 28 867, is advantageously repeated several times.

After an Nb$_3$Sn layer about 0.18 μm thick was removed, the measurements described above were repeated and the values given in the Table under Test No. 2 were obtained.

After these tests were finished, the Nb$_3$Sn layer was completely removed from the inside surface of the niobium part 1 by chemical polishing in a solution consisting of one part concentrated nitric acid and one part 40% hydrofluoric acid. The Nb$_3$Sn layer was removed after a polishing time of about 0.3 minutes. Since the niobium surface then was not yet very smooth, the chemical polishing was continued to a total depth of 20 μm.

Subsequently, the niobium part 1, thus freed of the Nb$_3$Sn layer, was anodically oxidized again on its inside and again provided with an Nb$_3$Sn layer in the same manner. The so coated niobium part 1, after it was removed from the quartz ampoule 3, was again rinsed with only acetone and, as likewise explained above, was installed in a cryostat together with a niobium coupler. In the subsequent measurement, the values given in Table under Test No. 3 were obtained.

After this measurement, a layer about 0.12 μm thick was again removed from the Nb$_3$Sn surface by anodic oxidation repeated several times and subsequent chemical dissolution of the oxide layer. Subsequently, measurements were carried out again, the result of which is listed in the Table under Test No. 4. These last-mentioned measuring values, however, were affected somewhat by dust which got into the cavity resonator during its assembly due to construction work in the laboratory building.

As the test results listed in the Table show, very high values for the quality factor Q$_o$ and for B$_c^{ac}$ at 1.5 K are obtained in cavity resonators which were provided with Nb$_3$Sn layers by the method according to the present invention. These are increased still further by anodic oxidation and subsequent chemical dissolution of the oxide layer. However, it is of special importance that the method according to the invention yields quality factors Q$_o$ of more than 10$^9$ even at temperatures of 4.2 K. This says that cavity resonators provided with Nb$_3$Sn layers by the method according to the present invention can also be used at temperatures, at which the use of niobium for high frequency applications is no longer possible. Measurements of the quality factor Q$_o$ at higher magnetic flux densities and measurements of the critical magnetic flux density B$_c^{ac}$ were not possible in the test explained above at 4.2 K because of the niobium coupler. In further tests, in which, besides a resonator cup provided with an Nb$_3$Sn layer in accordance with the invention, a coupler provided also with an Nb$_3$Sn layer was used, a critical magnetic flux density B$_c^{ac}$ of 78 mT was achieved at 4.2 K.

Of course, in addition to resonators of the TE$_{011}$ type, other resonators, e.g., such of the TM$_{010}$ type or resonator helices, can also be provided with Nb$_3$Sn layers by means of the method according to the present invention.

What is claimed is:

1. In a method for the manufacture of a superconductive Nb$_3$Sn layer on a niobium surface for high frequency applications in which tin is diffused into the niobium surface at an elevated temperature, the improvement comprising:
    (a) first anodically oxidizing the niobium surface to be provided with the Nb$_3$Sn layer;
    (b) placing said oxidized niobium surface in an evacuable reaction chamber;
    (c) evacuating said chamber;
    (d) then, after evacuation, exposing the niobium oxide layer so produced to a tin vapor atmosphere in such a manner that a tin layer is formed on the niobium oxide layer; and finally,
    (e) heating the niobium surface to a temperature of between 930 and about 1400° C for forming the Nb$_3$Sn layer.

2. The method according to claim 1 wherein said heating for forming the Nb$_3$Sn layer is carried out in the presence of a tin source.

3. The method according to claim 2 wherein said step of placing includes placing said oxidized niobium surface in said evacuable reaction chamber with a tin source and wherein said step of exposing comprises, after evacuation, heating the chamber in such a manner that, at first, the tin source is at a higher temperature than the niobium surface for forming the tin layer on the anodically oxidized niobium surface, and subsequently, bringing the niobium surface and the tin source to about the same temperature between 930 and about 1400° C.

4. The method according to claim 3 and further comprising first, within a time of about 30 minutes to 2 hours, bringing the anodically oxidized niobium surface from room temperature to a temperature of between 500 and 600 ° C and the tin source from room temperature to a temperature of between 800° and 900° C and, subsequently, heating the niobium surface and the tin source over a time of about 20 to 40 minutes of between 1000 and 1100° C and holding said tin source and niobium surface at this temperature for forming the Nb$_3$Sn layer.

5. The method according to claim 2 and further comprising forming, in said evacuable reaction chamber, a reaction zone which is separated from the rest of the chamber volume, disposing the tin source and the anodically oxidized niobium surface to be provided with the Nb$_3$Sn layer in said reaction zone, sealing said reaction zone from the rest of the chamber volume to such an extent that gases present or generated within said reaction zone during said step of evacuation of the reaction chamber, will be drawn off from the reaction zone, but the tin vapor pressure within the reaction zone will remain higher than the tin vapor pressure in the rest of the chamber during said step of heating and, during the heating and the subsequent heat treatment, continuously pumping off the reaction chamber.

6. The method according to claim 5 wherein said niobium surface to be provided with the $Nb_3Sn$ layer itself forms a boundary surface of said reaction zone.

7. The method according to claim 6 wherein the reaction zone is defined only by niobium surfaces or anodically oxidized niobium surfaces.

8. The method according to claim 5 wherein the total cross section of the connecting paths between the interior of the sealed reaction zone and the rest of the reaction chamber is smaller than the surface of the tin source.

9. The method according to claim 8 wherein the total cross section of the connecting paths is at most 25% of the surface of the tin source.

10. The method according to claim 5 wherein the surface of the tin source is larger than 0.2% of the niobium surface to be provided with the $Nb_3Sn$ layer.

11. The method according to claim 10 wherein said surface of the tin source is larger than 1% of the niobium surface to be provided with the $Nb_3Sn$ layer.

12. The method according to claim 5 wherein said pumping off of the reaction chamber and the heating of the reaction zone are carried out in such a manner that a residual gas pressure at the cold end of the reaction chamber connected to the pump does not exceed $10^{-4}$ Torr.

13. The method according to claim 1 wherein a niobium pentoxide layer 0.01 to 0.3 $\mu$m thick is generated by the anodic oxidation on the niobium surface to be provided with the $Nb_3Sn$ layer.

14. The method according to claim 12 wherein a niobium pentoxide layer 0.04 to 0.15 $\mu$m thick is generated.

15. The method according to claim 1 wherein the niobium surface is kept at the temperature between 930 and about 1400° C until an $Nb_3Sn$ layer with a thickness of between 0.5 and 5 $\mu$m is formed on the niobium surface.

16. The method according to claim 1 and further including gerating an oxide layer on the generated $Nb_3Sn$ layer by anodic oxidation and subsequently chemically dissolving said oxide layer again.

* * * * *